(12) United States Patent
Gong et al.

(10) Patent No.: US 12,307,804 B2
(45) Date of Patent: May 20, 2025

(54) FINGERPRINT COLLECTION DEVICE AND DISPLAY PANEL

(71) Applicant: WUHAN CHINA STAR OPTOELECTRONICS TECHNOLOGY CO., LTD., Wuhan (CN)

(72) Inventors: Fan Gong, Wuhan (CN); Fei Ai, Wuhan (CN); Jiyue Song, Wuhan (CN); Dewei Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/769,396

(22) PCT Filed: Mar. 10, 2022

(86) PCT No.: PCT/CN2022/080189
§ 371 (c)(1),
(2) Date: Apr. 15, 2022

(87) PCT Pub. No.: WO2023/164961
PCT Pub. Date: Sep. 7, 2023

(65) Prior Publication Data
US 2024/0135742 A1  Apr. 25, 2024
US 2024/0233433 A9  Jul. 11, 2024

(30) Foreign Application Priority Data
Mar. 2, 2022 (CN) .......................... 202210200185.5

(51) Int. Cl.
*G06V 40/13* (2022.01)
*H01L 27/12* (2006.01)
(Continued)

(52) U.S. Cl.
CPC ....... *G06V 40/1318* (2022.01); *H10D 86/441* (2025.01); *H10D 86/60* (2025.01); *H10F 77/334* (2025.01)

(58) Field of Classification Search
CPC . H01L 27/1225; H01L 27/146; H01L 27/124; H01L 27/1214; H01L 31/02164;
(Continued)

(56) References Cited

U.S. PATENT DOCUMENTS

| 2011/0062432 A1 | 3/2011 | Yamazaki et al. | |
| 2015/0102291 A1* | 4/2015 | Park ..................... | H10K 59/131 257/40 |

(Continued)

FOREIGN PATENT DOCUMENTS

| CN | 105977314 A | 9/2016 |
| CN | 107359168 A | 11/2017 |

(Continued)

OTHER PUBLICATIONS

International Search Report in International application No. PCT/CN2022/080189,mailed on Jun. 27, 2022.
(Continued)

*Primary Examiner* — Vongsavanh Sengdara
(74) *Attorney, Agent, or Firm* — PV IP PC; Wei Te Chung; Christopher S Ruprecht

(57) ABSTRACT

A fingerprint collection device and a display panel are provided. The fingerprint collection device includes: a base substrate, a driving circuit layer, a first passivation layer, a photodiode, a second passivation layer, and an electrode layer. A first electrode portion is electrically connected to the photodiode through a second via. A second electrode portion is electrically connected to a first signal trace and a second signal trace through a third via and a fourth via to form a bridge structure. Since the third via, the fourth via, and the
(Continued)

second via are formed in same process, one process can be saved.

20 Claims, 7 Drawing Sheets

(51) Int. Cl.
  *H01L 31/0216* (2014.01)
  *H10D 86/40* (2025.01)
  *H10D 86/60* (2025.01)
  *H10F 77/30* (2025.01)

(58) Field of Classification Search
  CPC ............ G06V 40/1318; H10D 86/441; H10D 86/423; H10D 86/40; H10D 86/60; H10F 77/334; H10F 39/12
  See application file for complete search history.

(56) References Cited

U.S. PATENT DOCUMENTS

| | | | | |
|---|---|---|---|---|
| 2019/0019813 | A1* | 1/2019 | Ren | H10D 86/60 |
| 2020/0091253 | A1* | 3/2020 | Liu | H10K 59/1213 |
| 2020/0111815 | A1* | 4/2020 | Lius | G09G 3/3225 |
| 2020/0119108 | A1* | 4/2020 | Park | G06F 3/0412 |
| 2021/0313384 | A1* | 10/2021 | Tada | H10F 39/198 |
| 2022/0037405 | A1* | 2/2022 | Ren | H10K 59/122 |
| 2022/0099864 | A1* | 3/2022 | Lee | G06F 3/0446 |
| 2022/0238578 | A1* | 7/2022 | Katsuta | H10F 39/18 |
| 2022/0320197 | A1* | 10/2022 | Wang | H10K 59/121 |
| 2022/0376006 | A1* | 11/2022 | Li | H10K 50/858 |
| 2022/0399421 | A1* | 12/2022 | Hai | H10K 59/65 |
| 2023/0110093 | A1* | 4/2023 | Matsumura | H04N 25/70 257/292 |
| 2023/0122965 | A1* | 4/2023 | He | H10K 59/1213 257/40 |
| 2023/0397449 | A1* | 12/2023 | Ozeki | H10K 39/32 |
| 2024/0185792 | A1* | 6/2024 | Tong | H10K 59/65 |

FOREIGN PATENT DOCUMENTS

| | | |
|---|---|---|
| CN | 107422560 A | 12/2017 |
| CN | 110444553 A | 11/2019 |
| CN | 111081732 A | 4/2020 |
| CN | 112259556 A | 1/2021 |
| CN | 112420617 A | 2/2021 |
| CN | 112599536 A | 4/2021 |
| CN | 112748598 A | 5/2021 |

OTHER PUBLICATIONS

Written Opinion of the International Search Authority in International application No. PCT/CN2022/080189, mailed on Jun. 27, 2022.

Chinese Office Action issued in corresponding Chinese Patent Application No. 202210200185.5 dated Feb. 26, 2025, pp. 1-8.

* cited by examiner

FINGERPRINT COLLECTION DEVICE AND DISPLAY PANEL

CROSS-REFERENCE TO RELATED APPLICATIONS

This application is a U.S. National Stage of International Application No. PCT/CN2022/080189, filed on Mar. 10, 2022, which claims the benefit and priority of Chinese Patent Application No. 202210200185.5, filed on Mar. 2, 2022, the entire contents of which are incorporated herein by reference.

TECHNICAL FIELD

The present disclosure relates to the display technology field, and more particularly to a fingerprint collection device and a display panel.

BACKGROUND ART

With the rapid development of the panel industry, in addition to the requirements for a high resolution, a wide viewing angle, and low power consumption of a display, enriching panel functions and increasing human-computer interactions is one of the main development directions of a current display panel. Optical fingerprints use differences of light reflection between finger valleys and finger ridges to convert optical signals into electrical signals to achieve the purpose of fingerprint recognition. However, a current fingerprint collection device has many manufacturing processes. This results in a high cost.

Technical Problem

Embodiments of the present disclosure provide a fingerprint collection device and a display panel to solve the technical problem of a high cost because a current fingerprint collection device has many manufacturing processes.

Technical Solution

To solve the above-mentioned problem, technical schemes provided by the present disclosure are described as follows.

A fingerprint collection device provided according to the present disclosure includes:
 a base substrate;
 a driving circuit layer disposed on one side of the base substrate, wherein the driving circuit layer includes a control transistor and a plurality of signal traces, the control transistor includes a gate electrode, a gate insulating layer, an active layer, and a source/drain metal layer which are stacked sequentially, the plurality of the signal traces include a first signal trace disposed in the same layer as the gate electrode and a second signal trace disposed in the same layer as the source/drain metal layer;
 a first passivation layer covering one side of the driving circuit layer away from the base substrate;
 a photodiode disposed on one side of the first passivation layer away from the base substrate, wherein the photodiode is electrically connected to the control transistor through a first via penetrating the first passivation layer, the source/drain metal layer includes a source electrode and a drain electrode, the drain electrode is electrically connected to the photodiode, and the source electrode is electrically connected to the second signal trace;
 a second passivation layer covering one side of the photodiode away from the base substrate; and
 an electrode layer disposed on one side of the second passivation layer away from the base substrate, wherein the electrode layer includes a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

In the fingerprint collection device provided according to the present disclosure, a material of the active layer is amorphous silicon, the control transistor further includes an ohmic contact layer, and the ohmic contact layer is disposed on one side of the active layer away from the base substrate.

In the fingerprint collection device provided according to the present disclosure, the fingerprint collection device further includes a light shielding layer, the light shielding layer is disposed on the one side of the first passivation layer away from the base substrate and corresponding to the control transistor, and the light shielding layer and the photodiode are disposed in the same layer.

In the fingerprint collection device provided according to the present disclosure, the light shielding layer at least includes a first light shielding layer and a second light shielding layer which are stacked sequentially, the photodiode at least includes a first semiconductor layer and an intrinsic semiconductor layer which are stacked sequentially, the first light shielding layer and the first semiconductor layer are disposed in the same layer, and the second light shielding layer and the intrinsic semiconductor layer are disposed in the same layer.

In the fingerprint collection device provided according to the present disclosure, an orthographic projection of the light shielding layer on the base substrate covers an orthographic projection of the active layer on the base substrate.

In the fingerprint collection device provided according to the present disclosure, the light shielding layer includes a third light shielding layer, the third light shielding layer is disposed on one side of the second light shielding layer away from the base substrate, the photodiode includes a second semiconductor layer, the second semiconductor layer is disposed on one side of the intrinsic semiconductor layer away from the base substrate, and the third light shielding layer and the second semiconductor layer are disposed in the same layer.

In the fingerprint collection device provided according to the present disclosure, a material of the active layer is metal oxide.

In the fingerprint collection device provided according to the present disclosure, the electrode layer further includes a third electrode portion, the driving circuit layer further includes a bonding terminal disposed in the same layer as the source/drain metal layer, and the third electrode portion is electrically connected to the bonding terminal through a fifth via penetrating the second passivation layer.

A fingerprint collection device provided according to the present disclosure includes:
 a base substrate;

a driving circuit layer disposed on one side of the base substrate, wherein the driving circuit layer includes a control transistor and a plurality of signal traces, the control transistor includes a gate electrode, a gate insulating layer, an active layer, and a source/drain metal layer which are stacked sequentially, the plurality of the signal traces include a first signal trace disposed in the same layer as the gate electrode and a second signal trace disposed in the same layer as the source/drain metal layer;

a first passivation layer covering one side of the driving circuit layer away from the base substrate;

a photodiode disposed on one side of the first passivation layer away from the base substrate, wherein the photodiode is electrically connected to the control transistor through a first via penetrating the first passivation layer;

a second passivation layer covering one side of the photodiode away from the base substrate; and an electrode layer disposed on one side of the second passivation layer away from the base substrate, wherein the electrode layer includes a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

In the fingerprint collection device provided according to the present disclosure, a material of the active layer is amorphous silicon, the control transistor further includes an ohmic contact layer, and the ohmic contact layer is disposed on one side of the active layer away from the base substrate.

In the fingerprint collection device provided according to the present disclosure, the fingerprint collection device further includes a light shielding layer, the light shielding layer is disposed on the one side of the first passivation layer away from the base substrate and corresponding to the control transistor, and the light shielding layer and the photodiode are disposed in the same layer.

In the fingerprint collection device provided according to the present disclosure, the light shielding layer at least includes a first light shielding layer and a second light shielding layer which are stacked sequentially, the photodiode at least includes a first semiconductor layer and an intrinsic semiconductor layer which are stacked sequentially, the first light shielding layer and the first semiconductor layer are disposed in the same layer, and the second light shielding layer and the intrinsic semiconductor layer are disposed in the same layer.

In the fingerprint collection device provided according to the present disclosure, an orthographic projection of the light shielding layer on the base substrate covers an orthographic projection of the active layer on the base substrate.

In the fingerprint collection device provided according to the present disclosure, the light shielding layer includes a third light shielding layer, the third light shielding layer is disposed on one side of the second light shielding layer away from the base substrate, the photodiode includes a second semiconductor layer, the second semiconductor layer is disposed on one side of the intrinsic semiconductor layer away from the base substrate, and the third light shielding layer and the second semiconductor layer are disposed in the same layer.

In the fingerprint collection device provided according to the present disclosure, the first semiconductor layer is an N-type semiconductor layer, and the second semiconductor layer is a P-type semiconductor layer.

In the fingerprint collection device provided according to the present disclosure, a material of the active layer is metal oxide.

In the fingerprint collection device provided according to the present disclosure, the electrode layer further includes a third electrode portion, the driving circuit layer further includes a bonding terminal disposed in the same layer as the source/drain metal layer, and the third electrode portion is electrically connected to the bonding terminal through a fifth via penetrating the second passivation layer.

A display panel provided according to the present disclosure includes: the above-mentioned fingerprint collection device;

an optical path structure; and a panel main body, wherein the optical path structure is disposed on a non-display surface of the panel main body, and the fingerprint collection device is disposed on one side of the optical path structure away from the panel main body;

wherein the fingerprint collection device includes:

a base substrate;

a driving circuit layer disposed on one side of the base substrate, wherein the driving circuit layer includes a control transistor and a plurality of signal traces, the control transistor includes a gate electrode, a gate insulating layer, an active layer, and a source/drain metal layer which are stacked sequentially, the plurality of the signal traces include a first signal trace disposed in the same layer as the gate electrode and a second signal trace disposed in the same layer as the source/drain metal layer;

a first passivation layer covering one side of the driving circuit layer away from the base substrate;

a photodiode disposed on one side of the first passivation layer away from the base substrate, wherein the photodiode is electrically connected to the control transistor through a first via penetrating the first passivation layer;

a second passivation layer covering one side of the photodiode away from the base substrate; and an electrode layer disposed on one side of the second passivation layer away from the base substrate, wherein the electrode layer includes a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

In the display panel provided according to the present disclosure, the base substrate is located on the one side of the optical path structure away from the panel main body;

the driving circuit layer is located on one side of the base substrate away from the panel main body;

the first passivation layer covers one side of the driving circuit layer away from the panel main body;

the photodiode is located on one side of the first passivation layer away from the panel main body;
the second passivation layer covers one side of the photodiode away from the panel main body; and
the electrode layer is located on one side of the second passivation layer away from the panel main body.

In the display panel provided according to the present disclosure, the fingerprint collection device further includes a light shielding layer, the light shielding layer is located on the one side of the first passivation layer away from the panel main body and is disposed corresponding to the control transistor of the driving circuit layer, and the light shielding layer and the photodiode are disposed in the same layer.

Advantageous Effects

The advantageous effects of the present disclosure are described as follows. In the fingerprint collection device and the display panel provided by the embodiments of the present disclosure, the fingerprint collection device includes the base substrate, the driving circuit layer, the first passivation layer, the photodiode, the second passivation layer, and the electrode layer. The first electrode portion of the electrode layer is electrically connected to the photodiode through the second via penetrating the second passivation layer. The driving circuit layer includes the control transistor and the plurality of signal traces. The first signal trace and the gate electrode of the control transistor are disposed in the same layer. The second signal trace and the source/drain metal layer of the control transistor are disposed in the same layer. Compared with the prior art in which the first signal trace and the second signal trace are electrically connected through a via penetrating the gate insulating layer, the second electrode portion of the electrode layer in the present disclosure is electrically connected to first signal trace and the second signal trace through the third via and the fourth via to form the bridge structure. The third via penetrates the second passivation layer, the first passivation layer, and the gate insulating layer. The fourth via penetrates the second passivation layer and the first passivation layer. Since the third via, the fourth via, and the second via are formed in same process, one process can be saved. This is beneficial to for save the cost.

BRIEF DESCRIPTION OF DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

Figure 1:
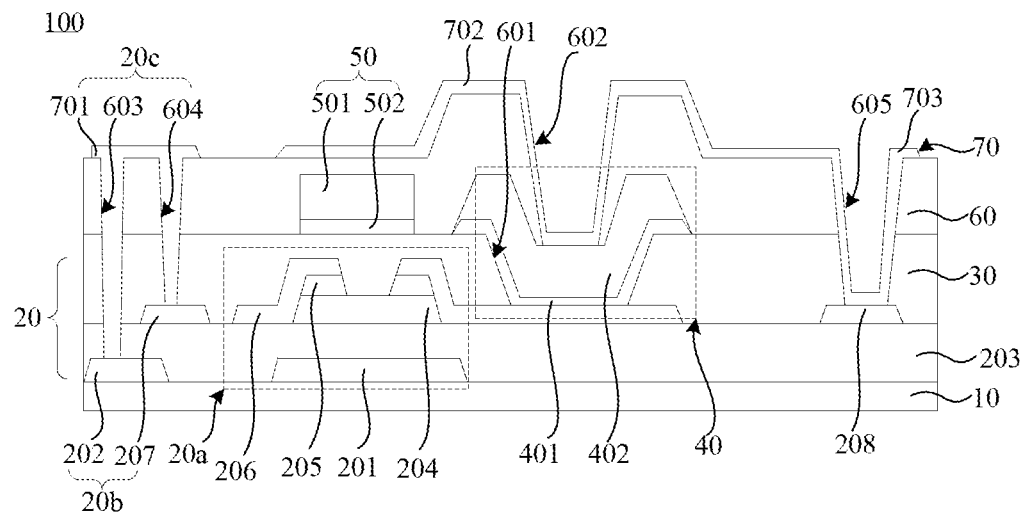
FIG. 1 illustrates a schematic diagram of a cross-sectional structure of a first fingerprint collection device provided by an embodiment of the present disclosure.

Numerals in the drawings are described as follows:
fingerprint collection device 100; optical path structure 200; panel main body 300; base substrate 10; driving circuit layer 20; control transistor 20a; signal traces 20b; bridge structure 20c; first passivation layer 30; photodiode 40; photodiode 50; second passivation layer 60; electrode layer 70; first electrode portion 701; second electrode portion 702; third electrode portion 703; gate electrode 201; first signal trace 202; gate insulating layer 203; active layer 204; ohmic contact layer 205; source/drain metal layer 206; second signal trace 207; bonding terminal 208; first semiconductor layer 401; intrinsic semiconductor layer 402; first light shielding layer 501; second light shielding layer 502; first via 601; second via 602; third via 603; fourth via 604; fifth via 605.

DETAILED DESCRIPTION OF EMBODIMENTS

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure. Furthermore, it should be understood that specific implementations described herein are only used to illustrate and explain the present disclosure, and are not used to limit the present disclosure. In the present disclosure, if no explanation is made to the contrary, used orientation words, such as "upper" and "lower", generally refer to upper and lower directions of a device in an actual use or a working state, and specifically refer to drawing directions in the drawings. Words "inner" and "outer" refer to an outline of a device.

Please refer to FIG. 1. FIG. 1 illustrates a schematic diagram of a cross-sectional structure of a first fingerprint collection device provided by an embodiment of the present disclosure. The fingerprint collection device 100 provided by the embodiment of the present disclosure includes a base substrate 10, a driving circuit layer 20, a first passivation layer 30, a photodiode 40, a second passivation layer 60, and an electrode layer 70. The driving circuit layer 20 is disposed on one side of the base substrate 10. The first passivation layer 30 covers one side of the driving circuit layer 20 away from the base substrate 10. The photodiode 40 is disposed on one side of the first passivation layer 30 away from the base substrate 10. The second passivation layer 60 covers one side of the photodiode 40 away from the base substrate 10. The electrode layer 70 is disposed on one side of the second passivation layer 60 away from the base substrate 10.

The driving circuit layer 20 includes a control transistor 20a and a plurality of signal traces 20b. The photodiode 40 is electrically connected to the control transistor 20a through a first via 601 penetrating the first passivation layer 30. The electrode layer 70 includes a first electrode portion 701, a second electrode portion 702, and a third electrode portion 703. The first electrode portion 701 is electrically connected to the photodiode 40 through a second via 602 penetrating the second passivation layer 60.

The control transistor 20a includes a gate electrode 201, a gate insulating layer 203, an active layer 204, and a source/drain metal layer 206 which are stacked sequentially. The plurality of the signal traces include a first signal trace 202 disposed in the same layer as the gate electrode 201 and a second signal trace 207 disposed in the same layer as the source/drain metal layer 206. The second electrode portion 702 is electrically connected to the first signal trace 202 and the second signal trace 207 through a third via 603 and a fourth via 604 to form a bridge structure 20c. The third via 603 penetrates the second passivation layer 60, the first passivation layer 30, and the gate insulating layer 203. The fourth via 604 penetrates the second passivation layer 60 and the first passivation layer 30.

Compared with the prior art in which the first signal trace 202 and the second signal trace 207 are electrically connected through a via penetrating the gate insulating layer 203, the second electrode portion 702 of the electrode layer 70 in the present disclosure is electrically connected to first signal trace 202 and the second signal trace 207 through the third via 603 and the fourth via 604 to form the bridge structure 20c. Since the third via 603, the fourth via 604, and the second via 602 are formed in same process, one process can be saved. This is beneficial to for save a cost.

Specifically, the source/drain metal layer 206 includes a source electrode and a drain electrode. A cathode of the photodiode 40 is electrically connected to the drain electrode, and an anode of the photodiode 40 is grounded. The source electrode can be electrically connected to the second signal trace 207. The gate electrode 201 of the control transistor 20a is electrically connected to the first signal trace 202. The first signal trace 202 can be a scan signal trace, and the second signal trace 207 can be a data signal trace. The first signal trace 202 needs to be connected to the second signal trace 207 through a jumper to be electrically connected to a driving chip (not shown in FIG. 1). The driving chip is configured to transmit signals to the first signal trace 202 and the second signal trace 207.

When a finger presses the fingerprint collection device 100, a reflected light intensity in valleys of the fingerprint and a reflected light intensity in ridges of the fingerprint are inconsistent. Accordingly, voltage drops generated across the photodiode 40 are different, and then the photodiode 40 generates different current values. The fingerprint collection device 100 can identify corresponding positions of the valleys and the ridges according to the different current values, that is, obtain fingerprint information of a subject.

Exemplarily, when the gate electrode 201 of the control transistor 20a is turned on, a voltage potential V1 is charged to the cathode of the photodiode 40 first. Then, the gate electrode 201 of the control transistor 20a is turned off. At this time, a voltage potential at the drain electrode of the control transistor 20a is V1, and the photodiode 40 is in a reverse biased state. When the finger presses a surface of the fingerprint collection device 100, reflected light from the valleys or the ridges irradiates the photodiode 40. Photons cause the current value of the reversely biased photodiode 40 to be changed. Since the light intensity in the valleys and the light intensity in the ridges are different, the changes of the current value are different. When the gate electrode 201 of the photodiode 40 is turned on again, the drain electrode of the control transistor 20a outputs different current values. Finally, the different current values can be obtained by reading the second signal trace 207, so as to facilitate the subsequent identification of the corresponding positions of the valleys and the ridges, that is, to obtain the fingerprint information of the subject.

Optionally, the base substrate 10 is a glass substrate. Compared with the fingerprint acquisition device 100 in the prior art using a single crystal silicon base substrate 10, a cost of the glass substrate is reduced. This is beneficial for saving the cost.

The photodiode 40 at least includes a first semiconductor layer 401 and an intrinsic semiconductor layer 402 which are stacked sequentially. The intrinsic semiconductor layer 402 is an undoped layer. Under the action of a reversed bias voltage, the intrinsic semiconductor layer 402 is depleted into a light absorbing region. This is results in higher quantum efficiency and shorter response time of the photodiode 40. In the embodiment of the present disclosure, the photodiode 40 includes the first semiconductor layer 401 and the intrinsic semiconductor layer 402. The first semiconductor layer 401 can be an N-type semiconductor layer. A material of the first semiconductor layer 401 is N+a-Si (amorphous silicon). A material of the intrinsic semiconductor layer 402 is amorphous silicon a-Si.

In other embodiments, the photodiode 40 includes the first semiconductor layer 401, the intrinsic semiconductor layer 402, and a second semiconductor layer (not shown in FIG. 1) which that are stacked sequentially. The second semiconductor layer 401 is disposed on one side of the intrinsic semiconductor layer 402 away from the base substrate 10. The first semiconductor layer 401 is an N-type semiconductor layer. The second semiconductor layer is a P-type semiconductor layer. A material of the first semiconductor layer 401 is N+a-Si (amorphous silicon). A material of the intrinsic semiconductor layer 402 is amorphous silicon a-Si. A material of the second semiconductor layer is P+a-Si.

In the prior art, the fingerprint collection device 100 adopts a silicon-based substrate, which is usually an external plug-in type. A fingerprint recognition area on a screen is only about a size of a thumb. The fingerprint recognition area is relatively small. Enlarging the fingerprint recognition area increase the cost of fingerprint recognition. In contrast, in the embodiment of the present disclosure, the material of the active layer 204 is amorphous silicon a-Si. As such, fabricating a large area on a display panel can be implemented, and an open hole can be selectively formed in any area of a screen as a fingerprint recognition area. Optical fingerprint recognition in a single area and optical fingerprint recognition in multiple areas can be realized, and the cost is reduced greatly.

The control transistor 20a further includes an ohmic contact layer 205. The ohmic contact layer 205 is disposed on one side of the active layer 204 away from the base substrate 10. The ohmic contact layer 205 is located between the active layer 204 and the source/drain metal layer 206. A material of the ohmic contact layer 205 can be N+a-Si. The N+a-Si refers to an N-type doped a-Si material.

The electrode layer 70 is multiplexed as a common electrode. The electrode layer 70 is a transparent electrode layer 70. A material of the electrode layer 70 includes indium tin oxide (ITO).

It can be understood that since the amorphous silicon a-Si has strong absorption for visible light. When the visible light is irradiated on the active layer 204, interference affects the active layer 204. This causes performance of the control transistor 20a to be degraded, thereby affecting sensitivity of the fingerprint collection device 100.

In view of this, in the embodiment of the present disclosure, the fingerprint collection device 100 further includes a light shielding layer 50. The light shielding layer 50 is disposed on one side of the first passivation layer 30 away from the base substrate 10 and corresponding to the control transistor 20a. The light shielding layer 50 and the photodiode 40 are disposed in the same layer, so that the light shielding layer 50 and the photodiode 40 can be formed by the same patterning process to simplify the manufacturing process of the fingerprint collecting device 100, and this is beneficial for further reducing the cost.

In the embodiment of the present disclosure, the light shielding layer 50 at least includes a first light shielding layer 501 and a second light shielding layer 502 which are stacked sequentially. The photodiode 40 at least includes the first semiconductor layer 401 and the intrinsic semiconductor layer 402 which are stacked sequentially. The first light shielding layer 501 and the first semiconductor layer 401 are disposed in the same layer, and the second light shielding layer 502 and the intrinsic semiconductor layer 402 are disposed in the same layer. That is, the first light shielding layer 501 and the first semiconductor layer 401 are formed by the same patterning process, and the second light shielding layer 502 and the intrinsic semiconductor layer 402 are formed by the same patterning process. While shading effect on the control transistor 20a is achieved, the manufacturing process of the fingerprint collection device 100 can be simplified. This is beneficial for further reducing the cost.

Specifically, materials of the first light shielding layer 501 and the first semiconductor layer 401 are the same and can be N+a-Si (amorphous silicon). Material of the second light shielding layer 502 and the intrinsic semiconductor layer 402 are the same and can be amorphous silicon a-Si. Since the amorphous silicon has strong absorption capacity for visible light, it can absorb incident light and reflected light reflected by the finger to the light shielding layer 50, thereby preventing light from irradiating the control transistor 20a to avoid that poor effects on the performance of the control transistor 20a are generated. In the present embodiment, thicknesses of the first light shielding layer 501 and the first semiconductor layer 401 are the same, and thicknesses of the second light shielding layer 502 and the second semiconductor layer are the same.

In other embodiments, when the photodiode 40 further includes the second semiconductor layer (not shown in FIG. 1), the light shielding layer 50 can further include a third light shielding layer. The third light shielding layer is disposed on one side of the second light shielding layer 502 away from the base substrate 10. The first light shielding layer 501, the second light shielding layer 502, and the third light shielding layer are stacked sequentially in a direction side away from the base substrate 10. That is, the third light shielding layer and the second semiconductor layer are disposed in the same layer. That is, the third light shielding layer and the second semiconductor layer are formed by the same patterning process. Materials of the third light shielding layer and the second semiconductor layer are the same and can be P+a-Si.

Further, in order to better realize light shielding effects, an orthographic projection of the light shielding layer 50 on the base substrate 10 covers an orthographic projection of the control transistor 20a on the base substrate 10. Further, the orthographic projection of the light shielding layer 50 on the base substrate 10 covers an orthographic projection of the active layer 204 on the base substrate 10. Further, the orthographic projection of the light shielding layer 50 on the base substrate 10 coincides with the orthographic projection of the active layer 204 on the base substrate 10.

Figure 2:
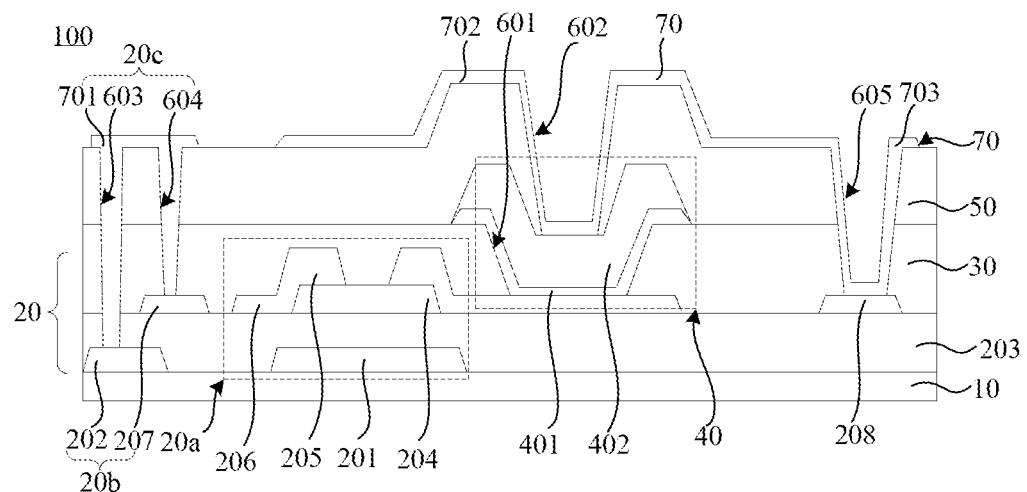
FIG. 2 illustrates a schematic diagram of a cross-sectional structure of a second fingerprint collection device provided by an embodiment of the present disclosure.

Please refer to an embodiment in FIG. 2. FIG. 2 illustrates a schematic diagram of a cross-sectional structure of a second fingerprint collection device provided by an embodiment of the present disclosure. A difference between FIG. 2 and FIG. 1 is that a material of the active layer 204 is metal oxide. Optionally, the material of the active layer 204 can include one of indium gallium zinc oxide (IGZO), indium zinc oxide (IZO), indium tin zinc oxide (ITZO), and zinc oxide (ZnO).

Similarly, when the metal oxide is served as the material of the active layer 204, the fingerprint collection device 100 can be fabricated on a large area of a display panel, and an open hole can be selectively formed in any area of a screen as a fingerprint recognition area. Optical fingerprint recognition in a single area and optical fingerprint recognition in multiple areas can be realized, and the cost is reduced greatly. Furthermore, different from the amorphous silicon, the metal oxides do not absorb visible light. Accordingly, when the incident light and the reflected light reflected by the finger to the light shielding layer 50 irradiate the control transistor 20a, interference is not generated to affect the active layer 204 and poor effects on the performance of the control transistor 20a are not generated. As such, in the embodiment of the present disclosure, it is not necessary to dispose the light shielding layer 50 above the control transistor 20a of the fingerprint collection device 100.

The driving circuit layer 20 further includes a bonding terminal 208 disposed on the same layer as the source/drain metal layer 206 and configured to bond with and connect to the driving chip. The third electrode portion 703 is electrically connected to the bonding terminal 208 through a fifth via 605 penetrating the second passivation layer 60. The driving chip is configured to apply a driving voltage to the third electrode portion 703 to drive the fingerprint collection device 100 to perform fingerprinting recognition.

The second via 602, the third via 603, the fourth via 604, and the fifth via 605 fabricated through the same yellow light process. This is beneficial for reducing the process and decreasing the cost.

Figure 3:
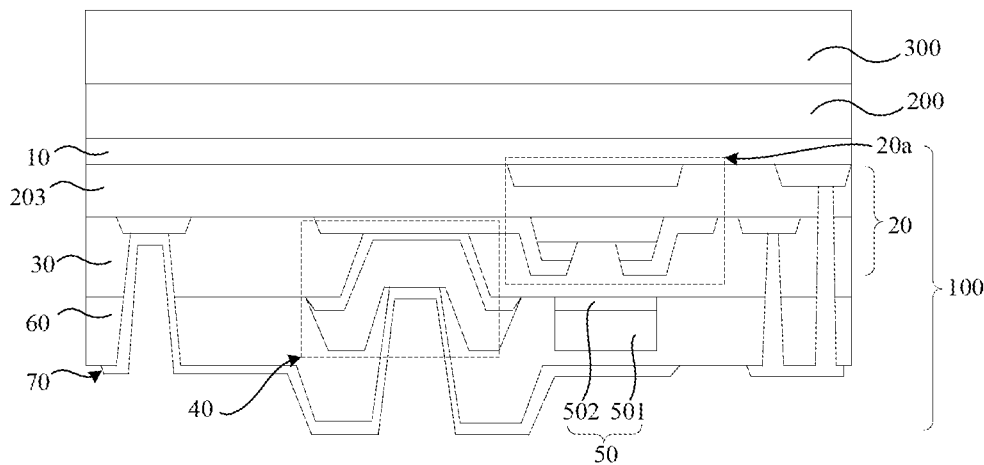
FIG. 3 illustrates a schematic diagram of a cross-sectional structure diagram of a display panel provided by an embodiment of the present disclosure.

Please refer to FIG. 3. FIG. 3 illustrates a schematic diagram of a cross-sectional structure diagram of a display panel provided by an embodiment of the present disclosure. The embodiment of the present disclosure further provides the display panel. The display panel includes the fingerprint collection device 100 in one of the above-mentioned embodiments. The display panel can realize optical fingerprint recognition in a single area and optical fingerprint recognition in multiple areas. The display panel further includes an optical path structure 200 and a panel main body 300. The optical path structure 200 is disposed on a non-display surface of the panel main body 300. The fingerprint collection device 100 is disposed on one side of the optical path structure 200 away from the panel main body 300. That is, the optical path structure 200 is disposed on a light incident side of the fingerprint collection device 100. The optical path structure 200 includes an optical fiber collimation layer to play a collimation function. When fingerprint identification is performed, a finger is pressed on a display surface of the panel main body 300, light reflected by the finger passes through the optical path structure 200 and is collected by the fingerprint collection device 100. The fingerprint collection device 100 can simultaneously receive the light reflected by the finger. The driving chip in the fingerprint collection device 100 can convert optical signals into electrical signal with different intensities, so as to process and recognize the electrical signals of fingerprint information of two or more fingers to implement the function of fingerprint recognition of two fingers or multiple fingers.

In the present embodiment, the fingerprint collection device 100 is in a flip-chip structure relative to the panel main body 300 and the optical path structure 200. Specifically, the fingerprint collection device 100 includes the base substrate 10, the driving circuit layer 20, the first passivation layer 30, the photodiode 40, the second passivation layer 60, and the electrode layer 70. The base substrate 10 is located on one side of the optical path structure 200 away from the panel main body 300. The driving circuit layer 20 is located on one side of the base substrate 10 away from the panel main body 300. The first passivation layer 30 covers one side of the driving circuit layer 20 away from the panel main body 300. The photodiode 40 is located on one side of the first passivation layer 30 away from the panel main body 300. The second passivation layer 60 covers one side of the photodiode 40 away from the panel main body 300. The electrode layer 70 is located on one side of the second passivation layer 60 away from the panel main body 300.

Further, the fingerprint collection device 100 further includes the light shielding layer 50. The light shielding layer 50 is configured to shield external light from one side away from the optical path structure 200, so as to prevent the external light from being mixed with light reflected by the finger to avoid that interference affects normal identification of the fingerprint collection device 100. Specifically, the light shielding layer 50 is located on the one side of the first passivation layer 30 away from the panel main body 300 and is disposed corresponding to the control transistor 20a of the driving circuit layer 20. The light shielding layer 50 and the photodiode 40 are disposed in the same layer.

Figure 4:
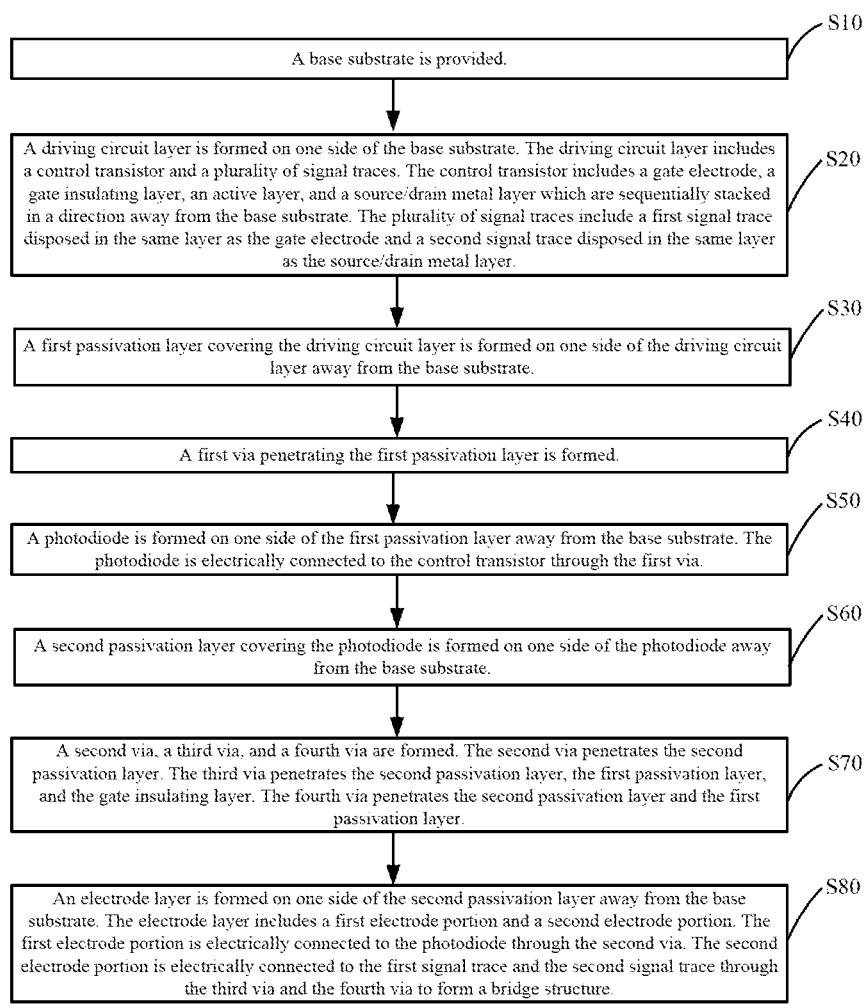
FIG. 4 illustrates a flowchart of a method for preparing a fingerprint collection device provided by an embodiment of the present disclosure.

Please refer to FIG. 4 and FIGS. 4A to 4K. FIG. 4 illustrates a flowchart of a method for preparing a fingerprint collection device provided by an embodiment of the present disclosure. FIGS. 4A to 4K illustrate a schematic diagram of a structural flowchart of a method for preparing a fingerprint collection device provided by an embodiment of the present disclosure. The embodiment of the present disclosure further provides the method for preparation the fingerprint collection device including the following steps.

In step S10, a base substrate 10 is provided.

Figure 4A:
FIGS. 4A to 4K illustrate a schematic diagram of a structural flowchart of a method for preparing a fingerprint collection device provided by an embodiment of the present disclosure.

Please refer to FIG. 4A in detail. The base substrate 10 is a glass substrate.

In step S20, a driving circuit layer 20 is formed on one side of the base substrate 10. The driving circuit layer 20 includes a control transistor 20a and a plurality of signal traces. The control transistor 20a includes a gate electrode 201, a gate insulating layer 203, an active layer 204, and a source/drain metal layer 206 which are sequentially stacked in a direction away from the base substrate 10. The plurality of signal traces include a first signal trace disposed in the same layer as the gate electrode 201 and a second signal trace 207 disposed in the same layer as the source/drain metal layer 206.

Specifically, step S20 includes the following steps.

In step S201, the gate electrode 201 and the first signal trace 202 are formed on the base substrate 10.

Figure 4B:
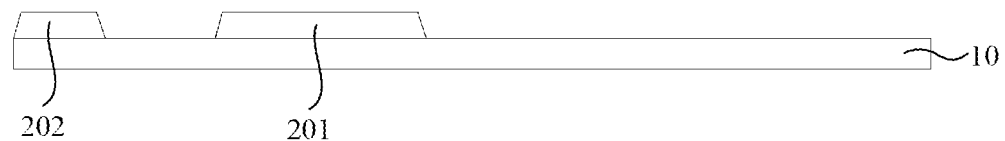

Please refer to FIG. 4B. First, a gate material layer is deposited on the base substrate 10. A yellow light process is performed to expose, develop, and etch the gate material layer to form the gate electrode 201 and the first signal trace 202.

In step S202, the gate insulating layer 203 covering the gate electrode 201 and the first signal trace 202 is formed.

Figure 4C:
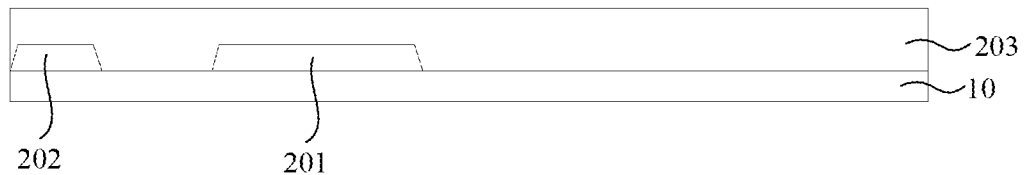

Please refer to FIG. 4C. an inorganic material layer is deposited on the base substrate 10, the gate electrode 201, and the first signal trace 202 to form the gate insulating layer 203. The inorganic material can be one of silicon nitride, silicon oxide, and silicon oxynitride.

In step S203, the active layer 204 is formed on one side of the gate insulating layer 203 away from the base substrate 10.

Figure 4D:
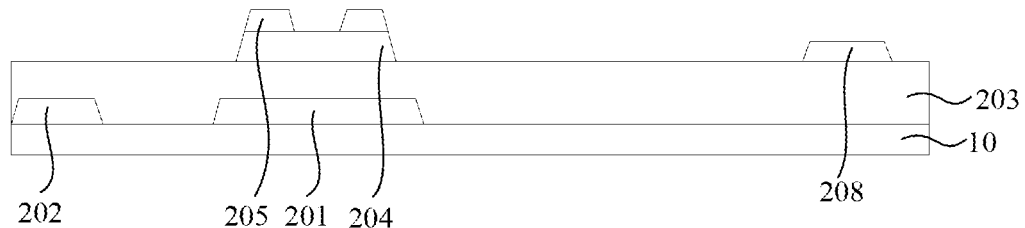

Please refer to FIG. 4D. First, an active material layer is deposited on the gate insulating layer 203. Then, a yellow light process is performed to expose, develop, and etch the active material layer to form the active layer 204. In the embodiment of the present disclosure, a material of the active layer 204 is amorphous silicon a-Si as an example.

Further, step S103 further includes the following step. An ohmic contact layer 205 is formed on one side of the active layer 204 away from the base substrate 10. A material of the ohmic contact layer 205 is N+a-Si. The ohmic contact layer 205 and the active layer 204 are prepared by the same yellow light process.

In step S204, the source/drain metal layer 206, the second signal trace 207, and a bonding terminal 208 are formed on the one side of the active layer 204 away from the base substrate 10.

Figure 4E:
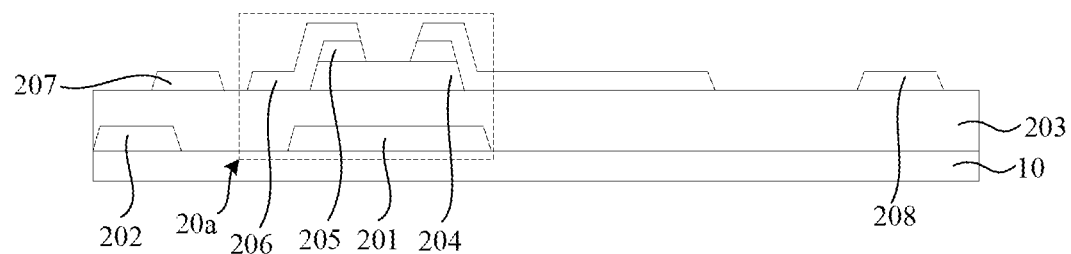

Please refer to FIG. 4E. First, a source/drain metal material layer is deposited on the active layer 204. Specifically, the source/drain metal material layer covering the gate insulating layer 203, the active layer 204, and the ohmic contact 205 is formed. Then, a yellow light process is performed to expose, develop, and etch the source/drain metal material layer to form the source/drain metal layer 206, the second signal trace 207, and the bonding terminal 208. The source/drain metal layer 206 includes a source electrode and a drain electrode. A channel is formed between the source electrode and the drain electrode. Materials of the source/drain metal layer 206, the second signal trace 207, and the bonding terminal 208 are N+a-Si.

In step S30, a first passivation layer 30 covering the driving circuit layer 20 is formed on one side of the driving circuit layer 20 away from the base substrate 10.

Figure 4F:
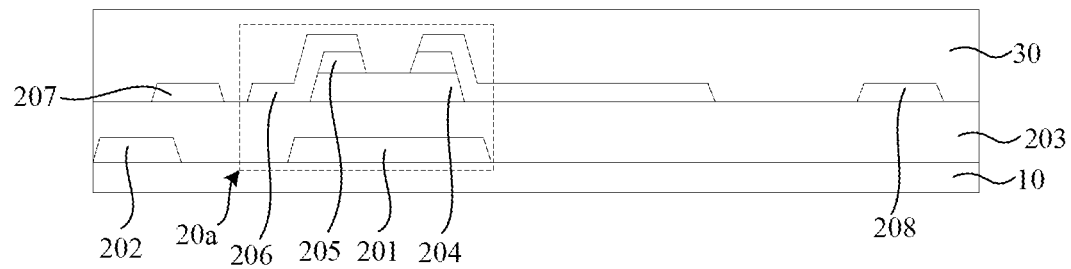

Please refer to FIG. 4F. The first passivation layer 30 is deposited and formed on the gate insulating layer 203, the source/drain metal layer 206, the second signal trace 207, and the channel. A material of the first passivation layer 30 can be one of silicon nitride, silicon oxide, and silicon oxynitride.

In step S40, a first via 601 penetrating the first passivation layer 30 is formed.

Figure 4G:
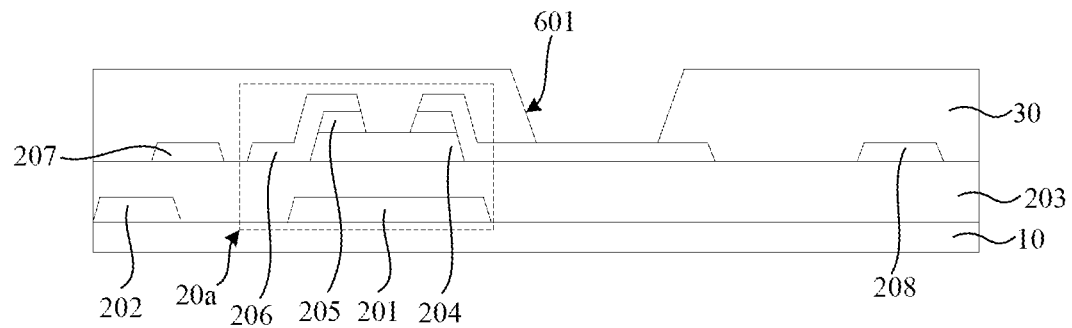

Please refer to FIG. 4G. A yellow light process is performed to expose, develop, and etch the first passivation layer 30 to form the first via 601 penetrating the first passivation layer 30.

In step S50, a photodiode 40 is formed on one side of the first passivation layer 30 away from the base substrate 10. The photodiode 40 is electrically connected to the control transistor 20a through the first via 601.

Specifically, step S50 includes the following steps.

In step S501, a first semiconductor layer 401 and an intrinsic semiconductor layer 402 are formed on in the first passivation layer 30 and the first via 601.

Figure 4H:
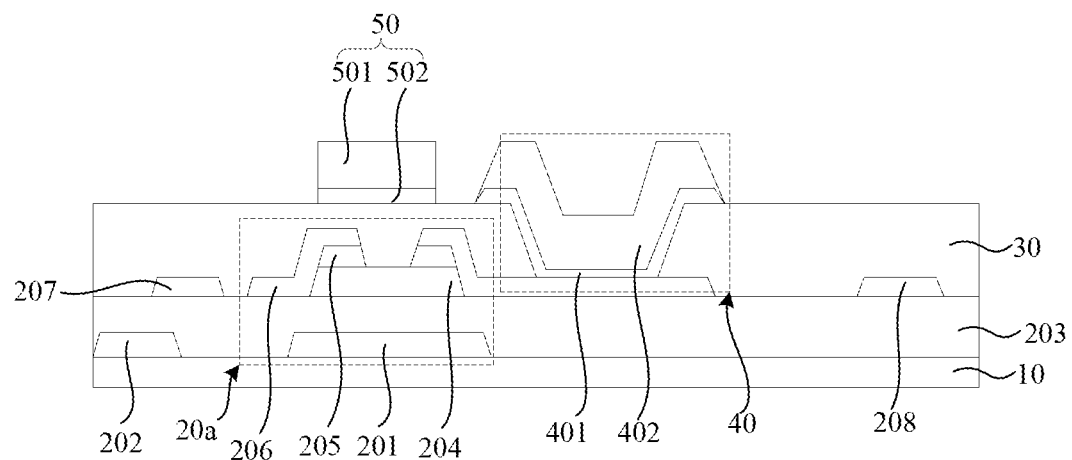

Please refer to FIG. 4H. First, a first semiconductor material layer and an intrinsic semiconductor material layer which are stacked are deposited and formed on the first passivation layer 30 and the source/drain metal layer 206 in the first via 601. Then, a yellow light process is performed to expose, develop, and etch the first semiconductor material layer and the intrinsic semiconductor material layer to form the first semiconductor layer 401. A material of the first semiconductor layer 401 can be N+a-Si, and a material of the intrinsic semiconductor layer 402 can be amorphous silicon a-Si.

Further, step S501 further includes the following steps. A light shielding layer 50 is formed on the one side of the first passivation layer 30 away from the base substrate 10. The light-shielding layer 50 is disposed corresponding to the control transistor 20a. The light shielding layer 50 and the photodiode 40 are formed by the same process.

Specifically, a first light shielding layer 501 and a second light shielding layer 502 which are stacked are formed on the one side of the first passivation layer 30 away from the base substrate 10. The first light shielding layer 501 and the first semiconductor layer 401 are disposed in the same layer. The second light shielding layer 502 and the intrinsic semiconductor layer 402 are disposed in the same layer. A material of the first light shielding layer 501 can be N+a-Si, and a material of the intrinsic semiconductor layer 402 can be amorphous silicon a-Si. The first light shielding layer 501, the second light shielding layer 502, the first semiconductor layer 401, and the intrinsic semiconductor layer 402 are prepared by the same yellow light process.

In step S60, a second passivation layer 60 covering the photodiode 40 is formed on one side of the photodiode 40 away from the base substrate 10.

Figure 4I:
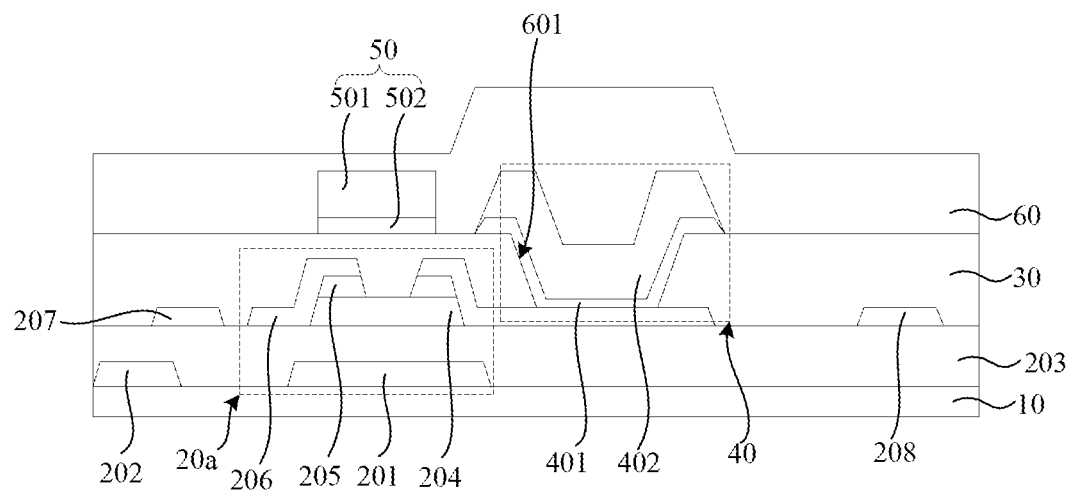

Please refer to FIG. 4I. The second passivation layer 60 is deposited and formed on the first passivation layer 30, the second light shielding layer 502, and the intrinsic semiconductor layer 402. A material of the passivation layer 60 can be one of silicon nitride, silicon oxide, and silicon oxynitride.

In step S70, a second via 602, a third via 603, and a fourth via 604 are formed. The second via 602 penetrates the second passivation layer 60. The third via 603 penetrates the second passivation layer 60, the first passivation layer 30, and the gate insulating layer 203. The fourth via 604 penetrates the second passivation layer 60 and the first passivation layer 30.

Figure 4J:
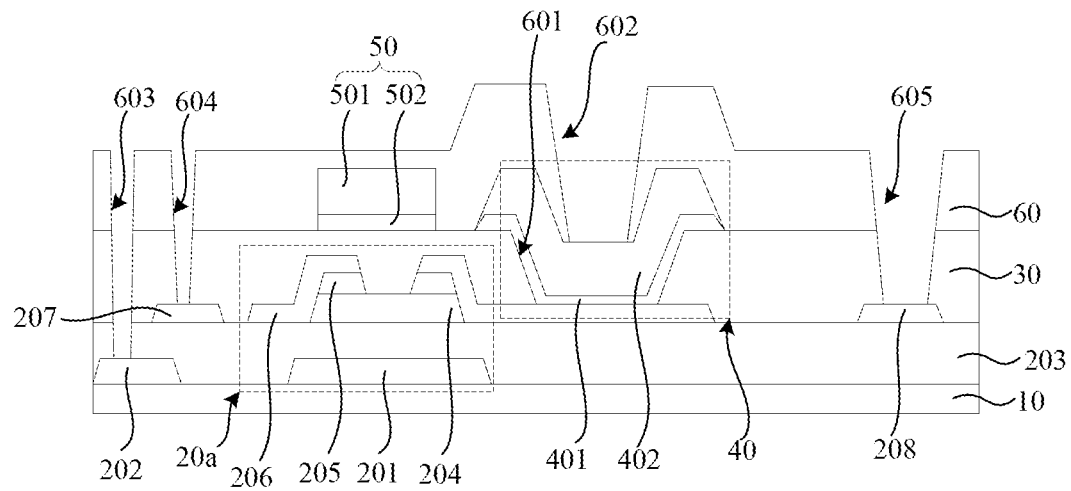

Please refer to FIG. 4J. A yellow light process is performed to expose, develop, and etch the second passivation layer 60 to form the second via 602, the third via 603, and the fourth via 604. Since the third via 603, the fourth via 604, and the second via 602 are formed in same process, one process can be saved. This is beneficial to for save a cost.

Further, step S70 further includes the following step. A fifth via 605 penetrating the second passivation layer 60 is formed. The second via 602, the third via 603, the fourth via 604, and the fifth via 605 are prepared by the same yellow light process. This is beneficial for reducing the process and decreasing the cost.

In step S80, an electrode layer 70 is formed on one side of the second passivation layer 60 away from the base substrate 10. The electrode layer 70 includes a first electrode portion 701 and a second electrode portion 702. The first electrode portion 701 is electrically connected to the photodiode 40 through the second via 602. The second electrode portion 702 is electrically connected to the first signal trace 202 and the second signal trace 207 through the third via 603 and the fourth via 604 to form a bridge structure 20c.

Figure 4K:
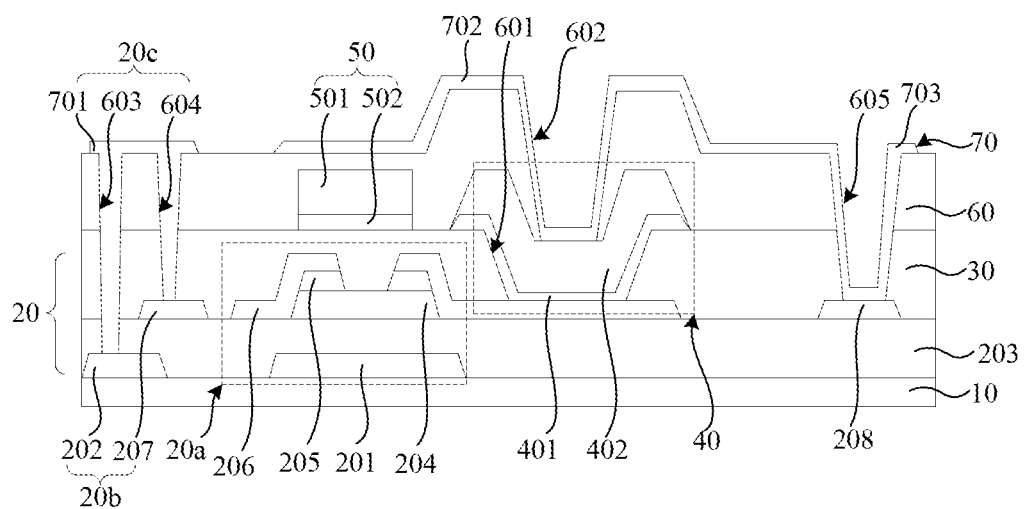

Please refer to FIG. 4K in detail. First, an electrode material layer is deposited on the second passivation layer 60. The electrode material layer covers the second passivation layer 60, the second via 602, the third via 603, the fourth via 604, and the fifth via 605. Then, a yellow light process is performed to expose, develop, and etch the electrode material layer to form the electrode layer 70. A material of the electrode layer 70 includes ITO.

It can be understood from the above that in the method for preparing the fingerprint collection device 100 provided by the embodiment of the present disclosure, seven yellow light manufacturing processes are required to complete the method for preparing the fingerprint collection device 100 and include: the gate electrode 201/the first signal trace 202/the bonding terminal 208, the active layer 204/the ohmic contact layer 205, the source/drain metal layer 206/the second signal trace 207/the bonding terminal 208, the first via 601, the photodiode 40/the light shielding layer 50, the second via 602/the third via 603/the fourth via 604/the fifth via 605, and the electrode layer 70. Compared with the fingerprint collection device 100 which adopts a silicon-based substrate in the prior art, the manufacturing processes required in the present disclosure are fewer. This is beneficial for reducing the cost.

Furthermore, the active layer 204 in the fingerprint collection device 100 in the present disclosure adopts amorphous silicon. As such, fabricating a large area on a display panel can be implemented, and an open hole can be selectively formed in any area of a screen as a fingerprint recognition area. Optical fingerprint recognition in a single area and optical fingerprint recognition in multiple areas can be realized, and the cost is reduced greatly.

Advantageous effects are described as follows. In the fingerprint collection device and the display panel provided by the embodiments of the present disclosure, the fingerprint collection device includes the base substrate, the driving circuit layer, the first passivation layer, the photodiode, the second passivation layer, and the electrode layer. The first electrode portion of the electrode layer is electrically connected to the photodiode through the second via penetrating the second passivation layer. The driving circuit layer includes the control transistor and the plurality of signal traces. The first signal trace and the gate electrode of the control transistor are disposed in the same layer. The second signal trace and the source/drain metal layer of the control transistor are disposed in the same layer. Compared with the prior art in which the first signal trace and the second signal trace are electrically connected through a via penetrating the gate insulating layer, the second electrode portion of the electrode layer in the present disclosure is electrically connected to first signal trace and the second signal trace through the third via and the fourth via to form the bridge structure. The third via penetrates the second passivation layer, the first passivation layer, and the gate insulating layer. The fourth via penetrates the second passivation layer and the first passivation layer. Since the third via, the fourth via, and the second via are formed in same process, one process can be saved. This is beneficial to for save the cost.

In summary, while the present disclosure is described in connection with preferred embodiments, the preferred embodiments are not intended to limit the present disclosure. Those skilled in the art can make various changes and modifications without departing from the spirit and scope of the present disclosure. Accordingly, the protection scope of the present disclosure is based on the scope defined by the claims.

What is claimed is:

1. A fingerprint collection device, comprising:
  a base substrate;
  a driving circuit layer disposed on one side of the base substrate, wherein the driving circuit layer comprises a control transistor and a plurality of signal traces, the control transistor comprises a gate electrode, a gate insulating layer, an active layer, and a source/drain metal layer which are stacked sequentially, the plurality of the signal traces comprise a first signal trace disposed in a same layer as the gate electrode and a second signal trace disposed in a same layer as the source/drain metal layer;
  a first passivation layer covering one side, away from the base substrate, of the driving circuit layer;

a photodiode disposed on one side, away from the base substrate, of the first passivation layer, wherein the photodiode is electrically connected to the control transistor through a first via penetrating the first passivation layer, the source/drain metal layer comprises a source electrode and a drain electrode, the drain electrode is electrically connected to the photodiode, and the source electrode is electrically connected to the second signal trace;

a second passivation layer covering one side, away from the base substrate, of the photodiode; and an electrode layer disposed on one side, away from the base substrate, of the second passivation layer, wherein the electrode layer comprises a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

2. The fingerprint collection device of claim 1, wherein a material of the active layer is amorphous silicon, the control transistor further comprises an ohmic contact layer, and the ohmic contact layer is disposed on one side of the active layer away from the base substrate.

3. The fingerprint collection device of claim 2, wherein the fingerprint collection device further comprises a light shielding layer, the light shielding layer is disposed on the one side of the first passivation layer away from the base substrate and corresponding to the control transistor, and the light shielding layer and the photodiode are disposed in a same layer.

4. The fingerprint collection device of claim 3, wherein the light shielding layer at least comprises a first light shielding layer and a second light shielding layer which are stacked sequentially, the photodiode at least comprises a first semiconductor layer and an intrinsic semiconductor layer which are stacked sequentially, the first light shielding layer and the first semiconductor layer are disposed in a same layer, and the second light shielding layer and the intrinsic semiconductor layer are disposed in a same layer.

5. The fingerprint collection device of claim 4, wherein materials of the first light shielding layer and the first semiconductor layer are the same, and materials of the second light shielding layer and the intrinsic semiconductor layer are the same.

6. The fingerprint collection device of claim 4, wherein a side of the first semiconductor layer close to the base substrate is in contact with a side surface of the source/drain metal layer exposed by the first via, and a side of the first electrode portion close to the base substrate is in contact with a side surface of the intrinsic semiconductor layer exposed by the second via.

7. The fingerprint collection device of claim 3, wherein an orthographic projection of the light shielding layer on the base substrate covers an orthographic projection of the active layer on the base substrate.

8. The fingerprint collection device of claim 3, wherein the light shielding layer comprises a third light shielding layer, the third light shielding layer is disposed on one side of the second light shielding layer away from the base substrate, the photodiode comprises a second semiconductor layer, the second semiconductor layer is disposed on one side of the intrinsic semiconductor layer away from the base substrate, and the third light shielding layer and the second semiconductor layer are disposed in a same layer.

9. The fingerprint collection device of claim 1, wherein a material of the active layer is metal oxide.

10. The fingerprint collection device of claim 1, wherein the electrode layer further comprises a third electrode portion, the driving circuit layer further comprises a bonding terminal disposed in the same layer as the source/drain metal layer, and the third electrode portion is electrically connected to the bonding terminal through a fifth via penetrating the second passivation layer.

11. A fingerprint collection device, comprising:
a base substrate;
a driving circuit layer disposed on one side of the base substrate, wherein the driving circuit layer comprises a control transistor and a plurality of signal traces, the control transistor comprises a gate electrode, a gate insulating layer, an active layer, and a source/drain metal layer which are stacked sequentially, the plurality of the signal traces comprise a first signal trace disposed in a same layer as the gate electrode and a second signal trace disposed in a same layer as the source/drain metal layer;
a first passivation layer covering one side, away from the base substrate, of the driving circuit layer;
a photodiode disposed on one side, away from the base substrate, of the first passivation layer, wherein the photodiode is electrically connected to the control transistor through a first via penetrating the first passivation layer;
a second passivation layer covering one side, away from the base substrate, of the photodiode; and
an electrode layer disposed on one side, away from the base substrate, of the second passivation layer, wherein the electrode layer comprises a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

12. The fingerprint collection device of claim 11, wherein a material of the active layer is amorphous silicon, the control transistor further comprises an ohmic contact layer, and the ohmic contact layer is disposed on one side of the active layer away from the base substrate.

13. The fingerprint collection device of claim 12, wherein the fingerprint collection device further comprises a light shielding layer, the light shielding layer is disposed on the one side of the first passivation layer away from the base substrate and corresponding to the control transistor, and the light shielding layer and the photodiode are disposed in a same layer.

14. The fingerprint collection device of claim 13, wherein the light shielding layer at least comprises a first light shielding layer and a second light shielding layer which are stacked sequentially, the photodiode at least comprises a first semiconductor layer and an intrinsic semiconductor layer which are stacked sequentially, the first light shielding layer and the first semiconductor layer are disposed in a same layer, and the second light shielding layer and the intrinsic semiconductor layer are disposed in a same layer.

15. The fingerprint collection device of claim 13, wherein an orthographic projection of the light shielding layer on the base substrate covers an orthographic projection of the active layer on the base substrate.

16. The fingerprint collection device of claim 13, wherein the light shielding layer comprises a third light shielding layer, the third light shielding layer is disposed on one side of the second light shielding layer away from the base substrate, the photodiode comprises a second semiconductor layer, the second semiconductor layer is disposed on one side of the intrinsic semiconductor layer away from the base substrate, and the third light shielding layer and the second semiconductor layer are disposed in a same layer.

17. The fingerprint collection device of claim 11, wherein the electrode layer further comprises a third electrode portion, the driving circuit layer further comprises a bonding terminal disposed in the a layer as the source/drain metal layer, and the third electrode portion is electrically connected to the bonding terminal through a fifth via penetrating the second passivation layer.

18. A display panel, comprising:
a fingerprint collection device;
an optical path structure; and
a panel main body, wherein the optical path structure is disposed on a non-display surface of the panel main body, and the fingerprint collection device is disposed on one side of the optical path structure away from the panel main body;
wherein the fingerprint collection device comprises:
a base substrate;
a driving circuit layer disposed on one side of the base substrate, wherein the driving circuit layer comprises a control transistor and a plurality of signal traces, the control transistor comprises a gate electrode, a gate insulating layer, an active layer, and a source/drain metal layer which are stacked sequentially, the plurality of the signal traces comprise a first signal trace disposed in a same layer as the gate electrode and a second signal trace disposed in the same layer as a source/drain metal layer;
a first passivation layer covering one side, away from the base substrate, of the driving circuit layer;
a photodiode disposed on one side, away from the base substrate, of the first passivation layer, wherein the photodiode is electrically connected to the control transistor through a first via penetrating the first passivation layer;
a second passivation layer covering one side, away from the base substrate, of the photodiode; and
an electrode layer disposed on one side, away from the base substrate, of the second passivation layer, wherein the electrode layer comprises a first electrode portion and a second electrode portion, the first electrode portion is electrically connected to the photodiode through a second via penetrating the second passivation layer, the second electrode portion is electrically connected to the first signal trace and the second signal trace through a third via and a fourth via to form a bridge structure, the third via penetrates the second passivation layer, the first passivation layer, and the gate insulating layer, and the fourth via penetrates the second passivation layer and the first passivation layer.

19. The display panel of claim 18, wherein the base substrate is located on the one side of the optical path structure away from the panel main body;
the driving circuit layer is located on one side of the base substrate away from the panel main body;
the first passivation layer covers one side of the driving circuit layer away from the panel main body;
the photodiode is located on one side of the first passivation layer away from the panel main body;
the second passivation layer covers one side of the photodiode away from the panel main body; and
the electrode layer is located on one side of the second passivation layer away from the panel main body.

20. The display panel of claim 19, wherein the fingerprint collection device further comprises a light shielding layer, the light shielding layer is located on the one side of the first passivation layer away from the panel main body and is disposed corresponding to the control transistor of the driving circuit layer, and the light shielding layer and the photodiode are disposed in a same layer.

* * * * *